(12) United States Patent
Lian et al.

(10) Patent No.: US 7,745,292 B2
(45) Date of Patent: Jun. 29, 2010

(54) METHOD FOR FABRICATING A SEMICONDUCTOR GATE STRUCTURE

(75) Inventors: Jingyu Lian, Hopewell Junction, NY (US); Jong Pyo Kim, Gyeonggi-do (KR)

(73) Assignees: Infineon Technologies AG, Neubiberg (DE); Samsung Electronics Co., Ltd., Suwon-Si (KR)

( * ) Notice: Subject to any disclaimer, the term of this patent is extended or adjusted under 35 U.S.C. 154(b) by 438 days.

(21) Appl. No.: 11/872,298

(22) Filed: Oct. 15, 2007

(65) Prior Publication Data
US 2009/0098692 A1 Apr. 16, 2009

(51) Int. Cl.
*H01L 21/8234* (2006.01)
(52) U.S. Cl. ............... 438/275; 438/585; 257/E21.632
(58) Field of Classification Search ............... 438/197, 438/199, 275, 585, 669; 257/E21.632
See application file for complete search history.

(56) References Cited

U.S. PATENT DOCUMENTS

2007/0243683 A1* 10/2007 Niimi et al. ............... 438/275
2008/0017921 A1* 1/2008 Jung ........................ 257/344

* cited by examiner

*Primary Examiner*—Thanhha Pham
(74) *Attorney, Agent, or Firm*—Slater & Matsil, L.L.P.

(57) ABSTRACT

A method of making a semiconductor device is disclosed. A mask if formed over a first and a second region of a semiconductor body, and a vertical diffusion barrier is formed in a region between the first and second regions. A mask is then formed over the second region and the first region is left unmasked. The semiconductor body is exposed to a dopant, so that the first region is doped and the second region is blocked from the dopant by the mask and by the vertical diffusion barrier.

28 Claims, 4 Drawing Sheets

METHOD FOR FABRICATING A SEMICONDUCTOR GATE STRUCTURE

TECHNICAL FIELD

This invention relates generally to semiconductor devices and methods, and more particularly to devices and methods for fabricating gate structures.

BACKGROUND

Semiconductor devices are used in a large number of electronic devices, such as computers, cell phones and others. One of the goals of the semiconductor industry is to continue shrinking the size and increasing the speed of individual devices. As devices shrink in size, the distance between devices also shrinks. One challenge is in processing adjacent devices so that process steps, such as doping, affects a target device, but not an adjacent device.

The shrinking of the critical dimension in semiconductor processes creates a tough challenge in the creation of a gate stack for complimentary metal oxide semiconductor (CMOS) transistors. In the creation of CMOS circuits, especially CMOS logic and memory circuits, it is common to have both n-channel MOS (NMOS) devices and p-channel MOS (PMOS) devices in close proximity to each other. Such a close proximity becomes especially challenging with respect to semiconductor processing.

In order to improve the performance of MOS devices, the gates of MOS devices are often implanted with a dopant to adjust the threshold, Vt. In a particular small geometry CMOS process, for example a 45 nm or a 65 nm process, the gates of NMOS devices can be doped prior to patterning, while the gates of PMOS devices remain undoped. A typical process implementation will mask the PMOS gate regions with a layer of resist prior to exposing the entire gate layer to an n+ ion implant. In small geometry processes, however, masking the PMOS regions is not entirely effective in preventing the ion implant from any doping of the PMOS gate regions. Because of the close proximity of NMOS gate regions to PMOS gate regions, n+ dopants can enter the PMOS gate region along the edge of the resist layer. Unintentional doping of the PMOS gate regions is disadvantageous because it can cause substantial Vt variation in PMOS devices. Such a Vt variation can cause performance problems including non-optimal circuit performance and device failures.

In the field of small, densely packed applications using small geometry transistors, what is needed is a method and structure that can selectively and precisely prevent regions of the semiconductor body from being doped during a semiconductor doping process.

SUMMARY OF THE INVENTION

In one embodiment of the present invention, a method of making a semiconductor device is provided. A mask is formed over a first and a second region of a semiconductor body, and a vertical diffusion barrier is formed in a region between the first and second regions. A mask is then formed on the second region and the first region is left unmasked. The semiconductor body is exposed to a dopant, so that the first region is doped and the second region is blocked from the dopant by the mask and by the vertical diffusion barrier.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The invention will now be described with respect to preferred embodiments in a specific context, namely a method for fabricating a plurality of MOS transistors. Concepts of the invention can also be applied, however, to other electronic devices, such as, devices that have a limited dopant area, but need to avoid adjacent dopant diffusion.

Figure 1A:
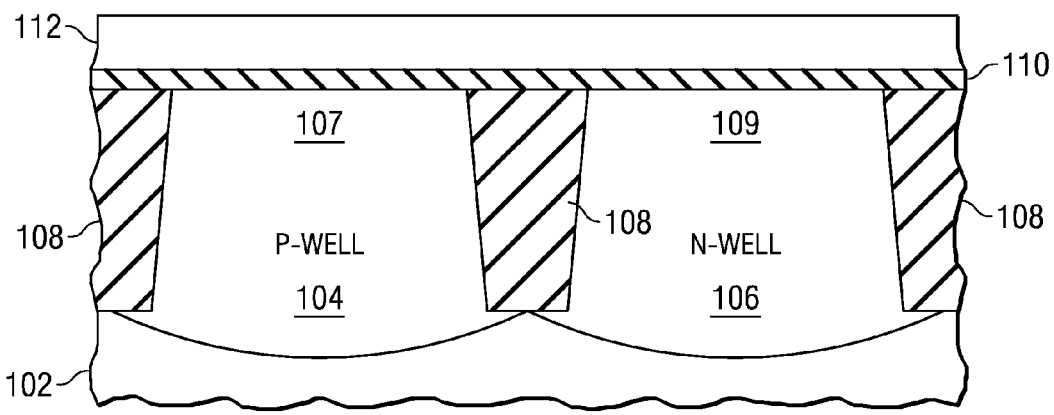
FIGS. 1a-1c illustrate an embodiment method for forming a semiconductor device.

Referring first to FIG. 1a, a semiconductor body 102 is provided. In a preferred embodiment of the present invention, a p-well region 104 and an n-well region 106 are formed within semiconductor body 102, and shallow trench isolation (STI) regions 108, a gate dielectric layer 110 and a gate electrode layer 112 are disposed at a surface over semiconductor body 102.

In a preferred embodiment of the present invention, semiconductor body 102 may be a bulk monocrystalline substrate, or a layer of silicon-on-insulator substrate. In other embodiments, other materials may be utilized. As shown in FIG. 1a, isolation is preferably achieved with STI regions 108 fabricated using conventional techniques. In other embodiments, other isolation techniques can be used. For example, STI regions 108 can be replaced with deep trench isolation regions, field oxide isolation regions, or other regions. STI regions 108 define an NMOS active area 107 and a PMOS active area 109 in which integrated circuit components can be formed.

As also shown in FIG. 1a, gate stack layers are formed. A gate dielectric layer 110 is deposited over exposed portions of semiconductor body 102. In one embodiment, the gate dielectric layer 110 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used for the gate dielectric layer 110. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric layer 110 can comprise other high-k insulating materials or other dielectric materials. As implied above, the gate dielectric layer 110 may comprise a single layer of material, or alternatively, the gate dielectric layer 110 may comprise two or more layers.

The gate dielectric layer 110 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric layer 110 may be deposited using other suitable deposition techniques. The gate dielectric layer 110 preferably comprises a thickness of about 10 Å to about 60 Å in one embodiment, although alternatively, the gate dielectric layer 110 may comprise other dimensions.

In the illustrated embodiment, the same dielectric layer would be used to form the gate dielectric layer 110 for both the p-channel and n-channel transistors. This feature is not required, however. In alternative embodiments, the p-channel transistor and the n-channel transistor could each have a different gate dielectric.

The gate electrode layer 112 is formed over the gate dielectric layer 110. The gate electrode layer 112 preferably comprises a semiconductor material, such as polysilicon or amorphous silicon, although alternatively, other semiconductor materials may be used for the gate electrode layer 112. In other embodiments, the gate electrode layer 112 may comprise TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In a preferred embodiment of the present invention, the thickness of the gate electrode layer is preferably between 800 Å to about 1500 Å, although the gate electrode layer 112 may comprise other thicknesses.

Figure 1B:
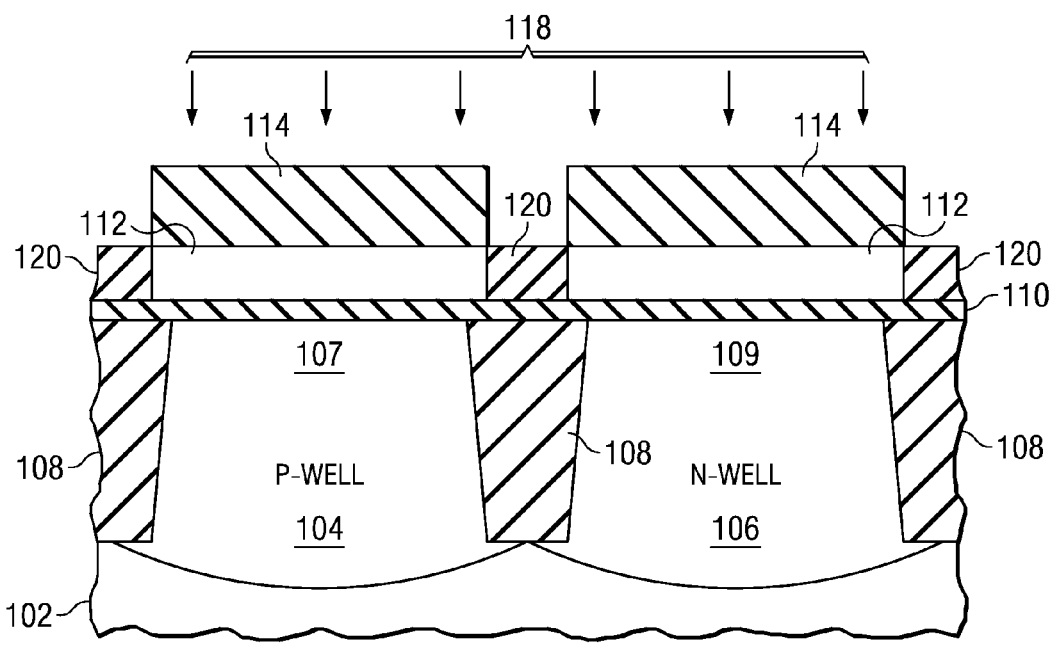

FIG. 1b illustrates the formation of a resist layer 114 over active regions 107 and 109, leaving regions outside of the active areas over the STI regions 108 uncovered. In a preferred embodiment of the present invention, the resist is applied and patterned using standard techniques, for example, a layer of resist with a layer of anti-reflective coating (ARC) disposed above or below the resist. Alternatively, other techniques such using a tri-layer resist, which includes a silicon containing layer disposed beneath and ARC layer, can be used. In a preferred embodiment of the present invention, the mask (not shown) used to pattern resist layer 114 can be the same mask used to define STI regions 108. By using the same mask as the mask used for STI regions 108, the cost of an additional mask can be eliminated. In an alternative embodiment, however, a separate mask can be used. For example, a separate mask can be generated from the masks which define the active area and the wells.

A block layer implant 118 is performed to produce vertical diffusion barriers 120 in regions not covered by the resist 114 layer in the gate electrode layer 112. In a preferred embodiment of the present invention, the block layer implant 118 is achieved by exposing the semiconductor body to an ion implant of either oxygen, nitrogen, carbon, or a metal such as tungsten. Alternatively, in other embodiments, other materials can be used. The implant is preferably performed at room temperature with an implantation energy between about 5 kV and about 10 kV and an implant dose of between about $2\times10^{15}$ and $9\times10^{15}$ particles per $cm^2$. In alternate embodiments, other implantation energies and implant doses can be used.

Figure 1C:
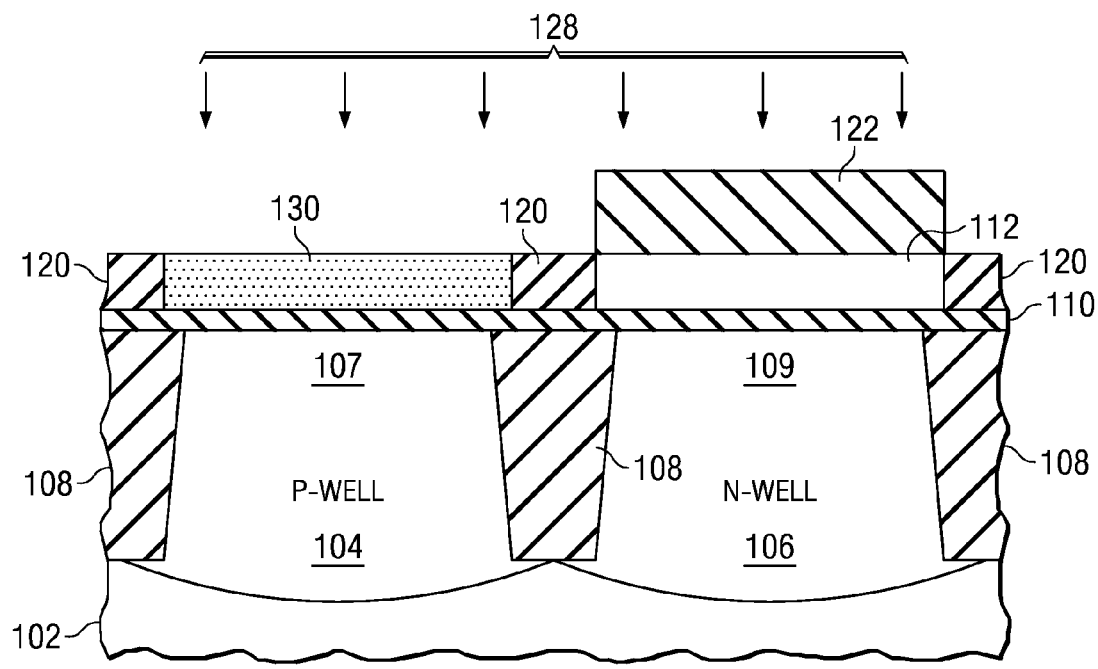

FIG. 1c illustrates a cross section of the process after resist layer 114 (see FIG. 1b) is stripped, and a new layer of resist 122 is applied and patterned using conventional techniques. Next, an ion implantation 128 is performed to dope the gate electrode layer 130 overlying active region 107. In a preferred embodiment of the present invention, only the gates of the NMOS devices are doped with n-type ions to create an n+ region of the gate electrode layer 130. The n-type ion implant 128 is preferably performed by implanting arsenic or phosphorous ions at room temperature with an implantation energy between about 5 kV and about 13 kV and an implant dose of between about $10^{14}$ and $10^{16}$ particles per $cm^2$. In alternate embodiments, other materials such as germanium and other doses and energies may be used. During the ion implantation process 128, resist 122 and vertical diffusion barriers 120 prevent n-type ions from being implanted in the region of the gate electrode layer 112 over the PMOS active area 109. After the ion implantation 128 is performed, resist 122 is stripped using conventional methods.

Alternatively, in other embodiments, the gates of the PMOS devices may be doped, or the gates of both the NMOS and PMOS devices may be doped. For example, if the gate regions of a PMOS device were to be doped, the active area 107 over p-well 104 would be covered with resist (not shown), and a p-type implant (not shown) would be performed to dope the gate electrode region 112 overlying the active region 109 and the n-well 106. For example, a p-type ion implant could be performed by implanting boron ions at room temperature with an implantation energy between about 5 kV and about 14 kV and an implant dose of between about $10^{14}$ and $10^{16}$ particles per $cm^2$. In alternate embodiments, other materials, doses and energies may be used. In yet other embodiments, the gate electrode layer 112 above PMOS active area 109 could be doped with either an n-type or p-type material and/or the gate electrode layer 130 above NMOS active area 107 could remain undoped, or be doped with an n-type or a p-type material.

Figure 2A:
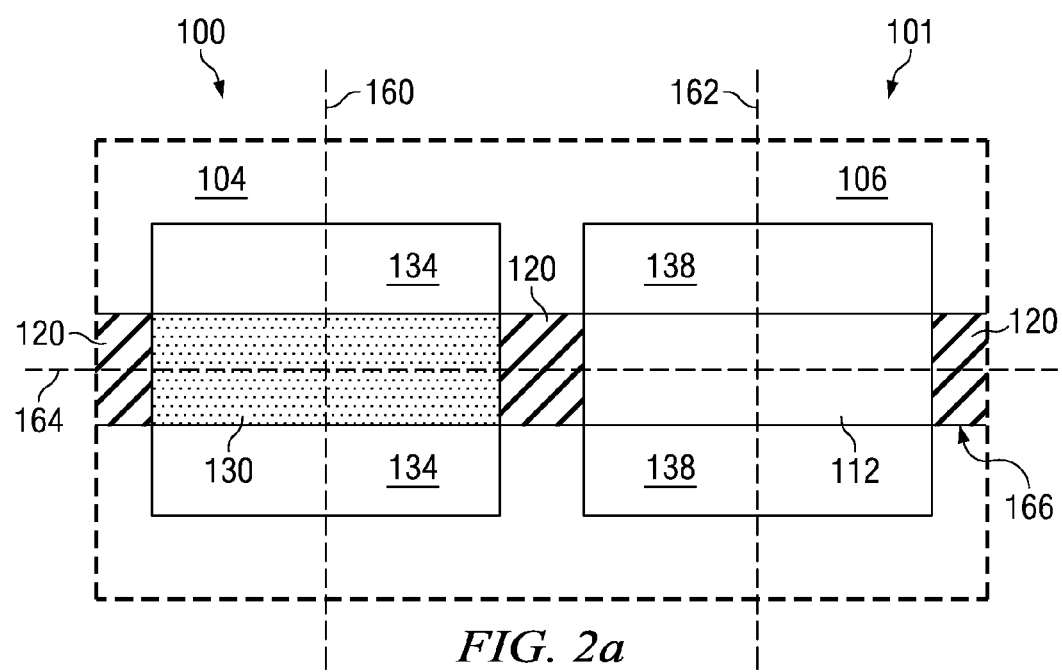
FIGS. 2a-2c illustrate a layout view and corresponding cross-sectional views of a pair of devices formed according to an embodiment of the present invention.

FIG. 2a shows a layout view of NMOS device 100 and PMOS device 101 after resist 122 has been stripped according to a preferred embodiment of the present invention. The figure shows the doped gate region 130 of NMOS device 100, the undoped gate region 112 of PMOS device 101, and the gate regions in which vertical diffusion barriers 120 have been implanted. NMOS source/drain regions 134, PMOS source/drain regions 138, P-well 104, and N-well 106 are also shown. Cross-sectional lines 160 and 162 correspond to cross-sectional illustrations in FIG. 2b and cross-sectional line 164 corresponds to the cross-sectional illustration in FIG. 2c.

Figure 2B:
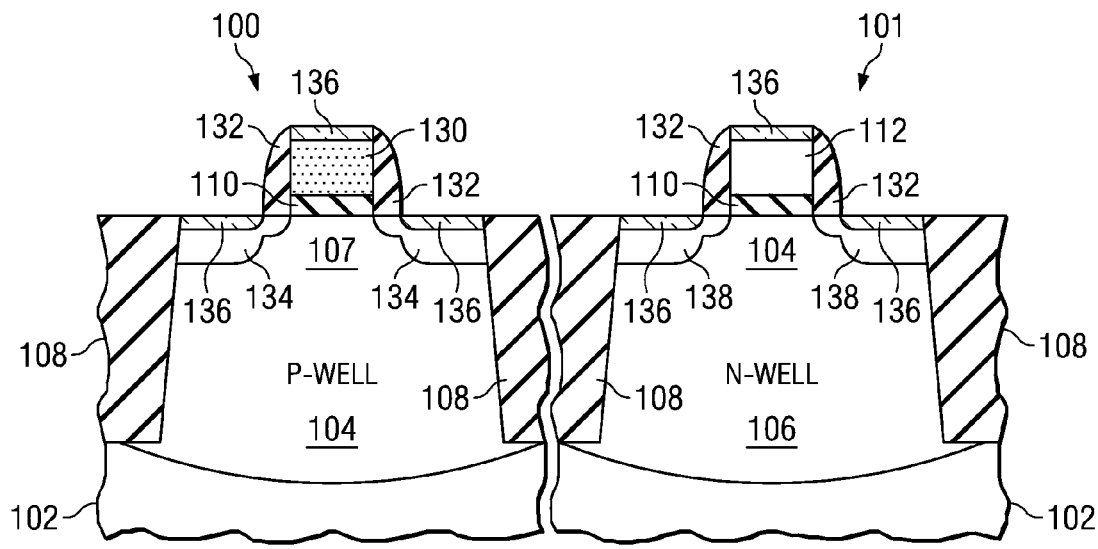

FIG. 2b shows cross sectional views of a NMOS device 100 and PMOS 101 formed according to a preferred embodiment of the present invention. These devices are shown after the formation of spacers 132, source/drain regions 134 & 138 and silicide regions 136, the formation of which is described herein below. The cross-section of NMOS device 100 corresponds to cross-sectional line 160 in FIG. 2a, and the cross-section of PMOS device 101 correspond to cross-sectional line 162 in FIG. 2c.

Turning to FIG. 2b, processing continues to complete the fabrication of NMOS device 100 and PMOS device 101. The gate electrode layer 112 and gate dielectric layer 110 are patterned and etched using conventional techniques, and spacers 132, which are formed from an insulating material such as an oxide and/or a nitride, can be formed on the sidewalls of the NMOS gate electrode 130 and PMOS gate electrode 112. After patterning and etching of the gate electrode layer 112, lightly doped source/drain regions (not shown) can be implanted using the gate electrode regions 112 and 130 as a mask. Other implants (e.g., pocket implants, halo implants or double diffused regions) can also be performed as desired.

The spacers 132 are typically formed by the deposition of a conformal layer followed by an anisotropic etch. The process can be repeated for multiple layers, as desired. Following the formation of spacers 132, the semiconductor body is exposed to a thermal activation step at a temperature between about 900° C. and 1200° C. for a duration of between about 2 seconds to 30 seconds. The thermal activation step enhances the doping of the gate electrode layer 112 by creating a more uniform vertical doping profile. This uniform vertical doping profile prevents the creation of a depletion layer with the gate electrode layer 112.

The upper surface of NMOS device 100 is exposed to an n-type source/drain implant forming the heavily doped source/drain regions 134. For example, As ions can be implanted with a dose of about $1\times10^{15}$ cm$^{-2}$ to about $5\times10^{15}$ cm$^{-2}$ and an implant energy between about 10 keV and about 50 keV. In other embodiments, other materials, such as P, can be implanted.

Either preceding or following the n-type source/drain implant, the upper surface of device 101 is exposed to a p-type ion implant forming the heavily doped source/drain regions 138. For example, boron ions can be implanted with a dose of about $5\times10^{14}$ cm$^{-2}$ to about $5\times10^{15}$ cm$^{-2}$ and an implant energy between about 1 keV and about 5 keV. In other embodiments, other materials, such as BF$_2$, can be implanted.

Silicide regions 136 can then be formed over the source/drain regions 134 and 138 and over the gate electrodes 112 and 130 to form low resistivity upper surface regions. Silicides are formed by first depositing a silicidation metal over source/drain regions 134 and 138 and over the gate electrodes 112 and 130, then subjecting the structure to an annealing process. In the preferred embodiment, the silicidation metal is nickel, but the metal could also be cobalt, copper, molybdenum, titanium, tantalum, tungsten, erbium, zirconium, platinum, or combinations thereof. In one example, the semiconductor body 102 is then heated to about 600° C. or 700° C. to form a single layer of nickel silicide.

After the formation of devices, an interlayer dielectric (ILD) layer (not shown) is formed over devices 100 and 101. Suitable ILD layers include materials such as doped glass (BPSG, PSG, BSG), organo silicate glass (OSG), fluorinated silicate glass (FSG), spun-on-glass (SOG), silicon nitride, and PE plasma enhanced tetraethyloxysilane (TEOS), as examples. In regions where the contact is to be made, for example in source/drain regions 134 and 138, the ILD layer is etched using standard etch techniques, and contacts are formed using standard metallization techniques.

Figure 2C:
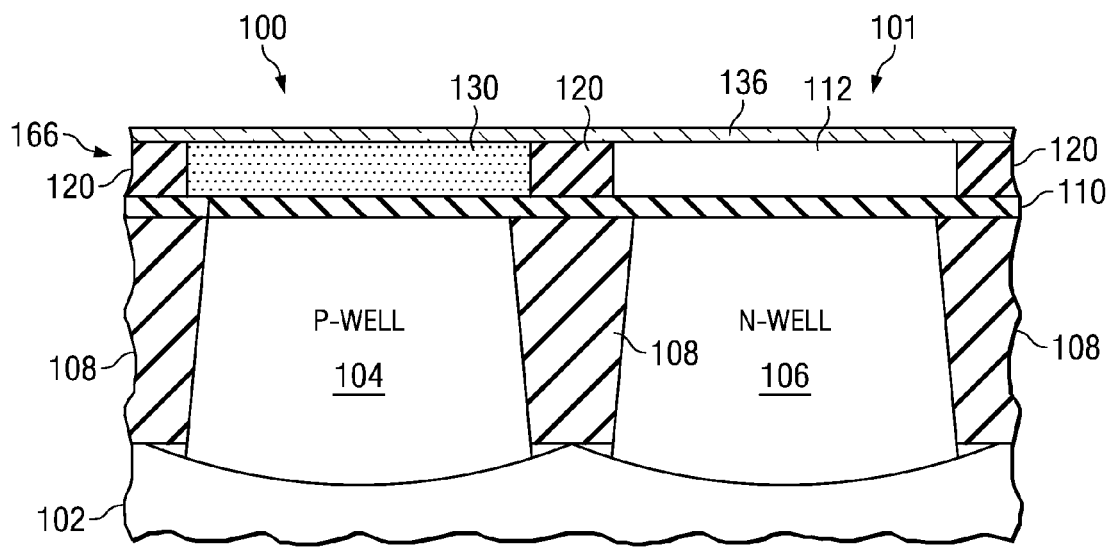

FIG. 2c shows a cross-section of NMOS device 100 and PMOS device 101 that corresponds to cross-cross sectional line 164 in FIG. 2a. This illustration shows how a single stripe of gate material 166 can form the gates of both an NMOS device 100 and PMOS device 101. Gate stripe 166 contains vertical diffusion barriers 120 as described herein above, as well as a doped gate region 130 for NMOS device 100. In this embodiment the PMOS device 101 gate region 112 remains undoped, but in other embodiments the PMOS device's 101 gate region 112 could be doped as well. FIG. 2c shows n-type source/drain regions 134 disposed adjacent to the n-type doped gate 130 within p-well region 104. FIG. 2c also shows p-type source/drain regions 138 disposed adjacent to undoped gate region 112 within n-well region 106. Sharing the gate stripe 166 as shown in FIG. 2c is advantageous whenever a tight a compact layout is necessary for applications such as SRAM and other logic applications.

Advantages of the embodiments of the invention disclosed herein include the ability to selectively prevent regions of the semiconductor body from being doped by using a vertical diffusion barrier 120. Without a vertical diffusion barrier 120, n-type ions could be absorbed at the perimeter of the gate electrode region 112 overlying PMOS active region 109. Even if absorbed n-type ions do not overly PMOS active region 109 after the implant, n-type ions in close proximity to the gate electrode region 112 overlying active region 109 may diffuse into the gate electrode region 112 overlying active region 109, thereby causing threshold shifts, unacceptable parametric variation, and device errors.

Figure 3:
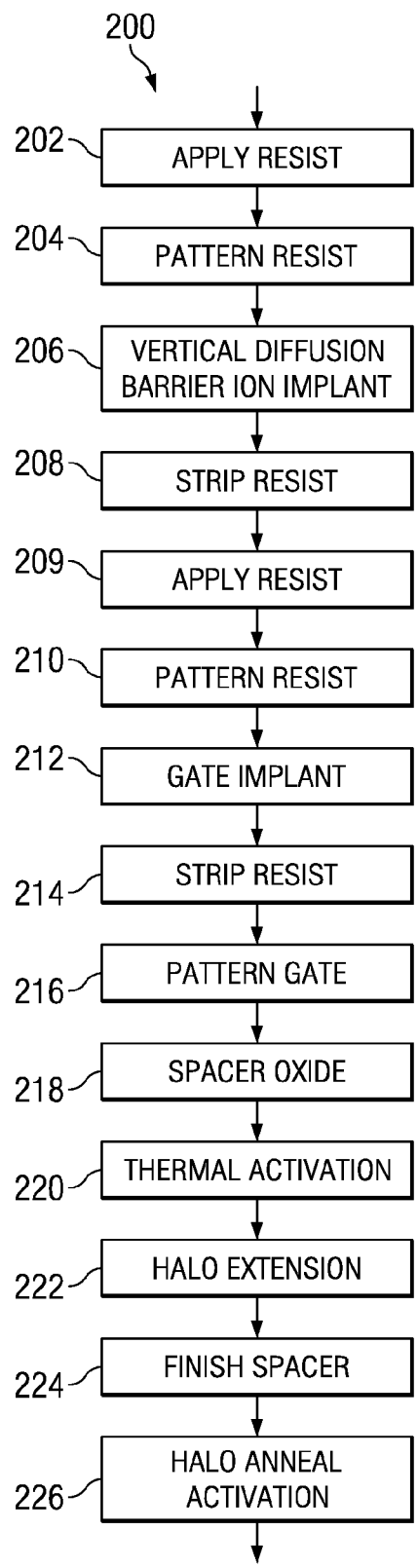
FIG. 3 illustrates an embodiment process for forming a semiconductor device.

Turning to FIG. 3, a process flow diagram is shown of a preferred embodiment process. Each of these steps is described herein above. The process 200 begins with a semiconductor wafer on which an unpatterned gate electrode layer and gate dielectric layer are provided. In step 202, resist is applied over the semiconductor body. In step 204, the resist is patterned and etched away on portions of the semiconductor body that require a vertical diffusion barrier. In step 206, the vertical diffusion barrier is implanted, and in step 208, the resist applied in step 202 is stripped.

Next, in step 209, a second layer of resist is applied over the semiconductor body. In step 210, this second layer of resist is patterned to expose areas of the gate dielectric layer that will receive a gate implant. In a preferred embodiment of the present invention, these regions include the NMOS gate regions. After a gate implant in step 212, in step 214 the second layer of resist is stripped, and the gate electrode layer is patterned and etched in step 216. In some embodiments of the present invention, the gate dielectric layer is patterned and etched at this point, also.

Processing continues with the application of a spacer oxide in step 218, the thermal activation process in step 220, and a halo extension in step 222. In some embodiments of the present invention, a second spacer is deposited about the gate region, or the first spacer is completed in step 224. After the spacer is completed, a halo anneal activation takes place in a preferred embodiment of the present invention in step 226.

In alternate embodiments of the present invention, some of the steps described herein above may be omitted, extra steps, and/or the ordering of the steps may be changed.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A method of making a semiconductor device, the method comprising:
   providing an unpatterned gate stack layer disposed over a semiconductor body, the gate stack comprising a gate electrode layer disposed over a gate dielectric layer;
   forming a vertical diffusion barrier in a region of the gate electrode layer between a first gate region and a second gate region;
   doping the first gate region; and
   patterning the gate stack layer, whereby a first gate stack is formed in the first gate region and a second gate stack is formed in the second gate region.

2. The method of claim 1, the method further comprising:
   before forming the vertical diffusion barrier, forming a first patterned resist region and a second patterned resist region over the gate dielectric layer, the first patterned resist region disposed over the first gate region, and the second patterned resist region disposed over the second gate region, wherein the forming the vertical diffusion barrier comprises forming a vertical diffusion barrier in a region of the gate electrode layer between the first patterned resist region and the second patterned resist region;
   stripping the first and second patterned resist regions after forming the vertical diffusion barrier; and
   after stripping the first and second patterned resist regions, forming a third resist region over the second gate region.

3. The method of claim 1, wherein the vertical diffusion barrier prevents the second gate region from being doped with a dopant used in doping the first gate region.

4. The method of claim 1, further comprising a thermal activation step after doping the first gate region.

5. The method of claim 4, wherein the vertical diffusion barrier prevents the second gate region from being doped with a dopant used in doping the first gate region.

6. The method of claim 4, wherein the thermal activation step comprises exposing the semiconductor body to a temperature of between about 900° C. and about 1200° C. for a duration of between about 2 seconds and 30 seconds.

7. The method of claim 1, wherein the forming the vertical diffusion barrier comprises an ion implant.

8. The method of claim 7, wherein the ion implant comprises implanting oxygen, nitrogen, carbon or metal.

9. A method of making a semiconductor device, the method comprising:
   providing a semiconductor body;
   forming a gate dielectric layer over the semiconductor body;
   forming a gate electrode layer over the gate dielectric layer;
   forming a first mask over a first gate region of the gate electrode layer and a second gate region of the gate electrode layer, wherein regions between the first gate region and second gate region comprise an exposed region not covered by the first mask;
   exposing the exposed region of the gate electrode layer to a barrier formation process, wherein a barrier region is formed in the exposed region of the gate electrode layer between the first and the second gate regions;
   removing the first mask on the first gate region and the second gate region of the gate electrode layer;
   forming a second mask on the second gate region; and
   doping the gate electrode layer with a dopant, wherein the gate electrode layer over the first gate region is doped, and wherein the gate electrode layer over the second gate region is blocked from the dopant by the second mask and/or by the barrier region.

10. The method of claim 9, further comprising patterning and etching the gate electrode layer, wherein a first gate stack is formed from the first gate region and a second gate stack is formed from the second gate region.

11. The method of claim 10, further comprising:
    fabricating a first spacer oxide adjacent to the first gate stack; and
    fabricating a second spacer oxide adjacent to the second gate stack.

12. The method of claim 10, further comprising thermally activating the first gate region and the second gate region.

13. The method of claim 10, further comprising doping portions of an active area adjacent to the first gate region and the second gate region to form source/drain regions.

14. The method of claim 13, wherein doping portions of the active area adjacent to the first gate region is an n-type doping, and wherein an NMOS device is formed about the first gate region.

15. The method of claim 13, wherein doping portions of the active area adjacent to the second gate region is a p-type doping, and wherein a PMOS device is formed about the second gate region.

16. The method of claim 9, wherein the barrier formation process comprises exposing the gate electrode layer to an implant.

17. The method of claim 16, wherein the implant comprises exposing the gate electrode layer to oxygen, nitrogen, carbon, or metal.

18. A method of making a semiconductor device, the method comprising:
    providing having a semiconductor layer thereon;
    forming a first mask on a first region of the semiconductor layer and a second mask on a second region, of the semiconductor layer, wherein an unmasked region of the semiconductor layer between the first and second regions is defined;
    forming a vertical diffusion barrier in the unmasked region;
    after forming the vertical diffusion barrier, forming a third mask on the second region, wherein the first region is unmasked;
    exposing the semiconductor body to a first dopant, wherein the first region is doped, and the second region is blocked from the first dopant by the third mask and by the vertical diffusion barrier patterning the semiconductor layer; and
    doping a region of the semiconductor body after the patterning.

19. The method of claim 18, wherein a NMOS device includes the first region and a PMOS device includes the second region are formed.

20. The method of claim 18, wherein the forming the vertical diffusion barrier comprises performing an ion implant.

21. The method of claim 18, further comprising a thermal activation step after exposing the semiconductor layer to the first dopant.

22. The method of claim 18, further comprising patterning and etching the first region and the second region.

23. The method of claim 18, wherein the vertical diffusion barrier and the third mask block substantially all of the dopants during the exposing the semiconductor layer to the first dopant step.

24. The method of claim 18, further comprising removing the first and second mask regions before forming the third mask.

25. The method of claim 18, further comprising:
  forming a fourth mask on the first region, wherein the second region is unmasked; and
  exposing the semiconductor layer to a second dopant, wherein the second region is doped, and the first region is blocked from the second dopant by the fourth mask and by the vertical diffusion barrier.

26. The method of claim 18, wherein the forming the first mask on the first region and the second mask on a second region comprises patterning a layer of resist.

27. The method of claim 26, wherein the patterning comprises exposing the layer of resist using a semiconductor mask having a same pattern as a mask used to define STI regions.

28. The method of claim 26, wherein the patterning comprises exposing the layer of resist using a semiconductor mask generated from an active area mask and a well design mask.

* * * * *

UNITED STATES PATENT AND TRADEMARK OFFICE
CERTIFICATE OF CORRECTION

PATENT NO. : 7,745,292 B2  Page 1 of 1
APPLICATION NO. : 11/872298
DATED : June 29, 2010
INVENTOR(S) : Lian et al.

It is certified that error appears in the above-identified patent and that said Letters Patent is hereby corrected as shown below:

In Col. 8, line 32, claim 18, after providing insert --a semiconductor body--.
In Col. 8, line 34, claim 18, delete "region," and insert --region--.
In Col. 8, line 42, claim 18, delete "semiconductor body" and insert --semiconductor layer--.
In Col. 8, line 45, claim 18, after barrier insert --;--.
In Col. 8, line 45, claim 18, insert new paragraph return before "patterning".
In Col. 8, line 51, claim 19, delete "are formed".

Signed and Sealed this

Twelfth Day of October, 2010

David J. Kappos
*Director of the United States Patent and Trademark Office*